United States Patent
Steinhögl et al.

(10) Patent No.: US 7,413,971 B2
(45) Date of Patent: Aug. 19, 2008

(54) METHOD OF PRODUCING A LAYERED ARRANGEMENT AND LAYERED ARRANGEMENT

(76) Inventors: Werner Steinhögl, Rosenbuschstr. 3, 80538, Munich, Deutschland (DE); Franz Kreupl, Mandlstr. 24, 80802, München, Deutschland (DE); Wolfgang Hönlein, Parkstr. 8 A, 82008, Unterhaching, Deutschland (DE)

( * ) Notice: Subject to any disclaimer, the term of this patent is extended or adjusted under 35 U.S.C. 154(b) by 294 days.

(21) Appl. No.: 10/498,421

(22) PCT Filed: Oct. 23, 2002

(86) PCT No.: PCT/DE02/03998

§ 371 (c)(1),
(2), (4) Date: Jan. 31, 2005

(87) PCT Pub. No.: WO03/050868

PCT Pub. Date: Jun. 19, 2003

(65) Prior Publication Data

US 2005/0196950 A1   Sep. 8, 2005

(30) Foreign Application Priority Data

Dec. 13, 2001   (DE) .............................. 101 61 312

(51) Int. Cl.
*H01L 21/44* (2006.01)

(52) U.S. Cl. ............ 438/597; 438/618; 257/734; 257/E55.04; 257/E21.476; 257/E21.477; 977/742

(58) Field of Classification Search ............ 257/E51.04, 257/E21.476, E21.477; 977/742; 438/597
See application file for complete search history.

(56) References Cited

U.S. PATENT DOCUMENTS 5,444,015 A * 8/1995 Aitken et al. ............... 438/619

(Continued)

FOREIGN PATENT DOCUMENTS

EP   1 059 266 A2   12/2000

(Continued)

OTHER PUBLICATIONS

Yih-Ming Shyu, Franklin Chau-Nan Hong, "The effects of pre-treatment and catalyst composition on growth of carbon nanofibers at low temperature", Diamond and Related Materials (2001), pp. 1241-1245.

(Continued)

*Primary Examiner*—Michael S. Lebentritt
*Assistant Examiner*—Angel Roman
(74) *Attorney, Agent, or Firm*—Dicke, Billig & Czaja, PLLC (57) ABSTRACT

An arrangement and process for producing a circuit arrangement is disclosed. The process includes having a layer arrangement, in which two electrically conductive interconnects running substantially parallel to one another are formed on a substrate. At least one auxiliary structure is formed on the substrate and between the two interconnects, running in a first direction, which first direction includes an angle of between 45 degrees and 90 degrees with a connecting axis of the interconnects, running orthogonally with respect to the two interconnects, the at least one auxiliary structure being produced from a material which allows the at least one auxiliary structure to be selectively removed from a dielectric layer. The dielectric layer is formed between the two interconnects, in such a manner that the at least one auxiliary structure is at least partially covered by the dielectric layer.

21 Claims, 6 Drawing Sheets

U.S. PATENT DOCUMENTS

| | | | |
|---|---|---|---|
| 5,461,003 A * | 10/1995 | Havemann et al. | 438/666 |
| 5,744,399 A * | 4/1998 | Rostoker et al. | 438/622 |
| 5,939,788 A * | 8/1999 | McTeer | 257/751 |
| 5,994,776 A | 11/1999 | Fang et al. | |
| 6,140,249 A * | 10/2000 | Sharan | 438/765 |
| 6,251,798 B1 | 6/2001 | Soo et al. | |
| 6,277,318 B1 | 8/2001 | Bower et al. | |
| 6,919,002 B2 * | 7/2005 | Chopra | 204/403.06 |
| 7,077,939 B1 * | 7/2006 | Crooks et al. | 204/450 |
| 7,229,909 B2 * | 6/2007 | Furukawa et al. | 438/622 |
| 2001/0002732 A1 | 6/2001 | Schwarzl et al. | |
| 2001/0024633 A1 | 9/2001 | Lee et al. | |
| 2003/0092251 A1 * | 5/2003 | Pheng et al. | 438/600 |
| 2003/0116531 A1 * | 6/2003 | Kamins et al. | 216/41 |
| 2007/0184647 A1 * | 8/2007 | Furukawa et al. | 438/622 |

FOREIGN PATENT DOCUMENTS

| | | |
|---|---|---|
| EP | 1 061 043 A1 | 12/2000 |
| EP | 1 069 588 | 1/2001 |
| GB | 2 327 535 | 1/1999 |

OTHER PUBLICATIONS

Z.F. Ren et al., "Growth of a single freestanding multiwall carbon nanotube on each nanonickel dot", Applied Physics Letters, Aug. 23, 1999, pp. 1086-1088.

Xueping Xu et al., "A method for fabricating large-area, patterned, carbon nanotube field emitters", Applied Physics Letters, Apr. 26, 1999, pp. 2549-2551.

Richard Feynman, "There's plenty of room at the bottom", The physics of nanotubes, pp. 111-155.

Peter J.F. Harris, "Carbon Nanotubes and Related Structures", Cambridge University Press, pp. 1-15.

E.D. Palik, "Handbook of Optical Constants of Solids", Ed. Press (1985), pp. 104-112.

W. Steinhogl, G. Schindler, "Towards Minimum k Values of Porous Dielectrics: A Simulation Study" Advanced Metallization Conference, (2001) (5 pages).

* cited by examiner

METHOD OF PRODUCING A LAYERED ARRANGEMENT AND LAYERED ARRANGEMENT

CROSS REFERENCE TO RELATED APPLICATIONS

This Utility Patent Application claims the benefit of the filing date of Application. No. DE 101 61 312.1. filed Dec. 13, 2001 and International Application No. PCT/DE02/03998. filed Oct. 23, 2002, both of which are herein incorporated by reference.

FIELD OF THE INVENTION

The invention relates to a process for producing a layer arrangement and to a layer arrangement.

BACKGROUND

Electrically insulating layers are required for many applications in semiconductor technology, in particular when forming integrated circuits in semiconductor substrates (for example in silicon substrates). If insulation layers are formed in an integrated circuit in which electrically conductive regions, in particular electrically conductive interconnects, are also included, coupling capacitances may result between adjacent interconnects and a dielectric layer arranged between them. The capacitance C of two parallel interconnects, the mutually adjacent surfaces of which are denoted by A and which are arranged at a distance d from one another, is, at a relative dielectric constant $\epsilon$:

$$C = \epsilon A/d \quad (1)$$

With ongoing miniaturization in silicon microelectronics, i.e. as the distance d between adjacent interconnects decreases, a high coupling capacitance C results in particular if the mutually adjacent surfaces A of the interconnects are large, i.e. if the interconnects run parallel to one another over a considerable length in the integrated circuit. By contrast, the coupling capacitance of two lines which cross one another is lower.

Problems with coupling capacitances are intensified by the ongoing miniaturization of integrated circuits. As the coupling capacitance increases, the propagation time of a signal in the electrical coupling means becomes ever longer, since this propagation time is determined by the product of resistance R and capacitance C (known as the "RC delay").

As can be seen from equation (1), with fixed structure dimensions A, d, it is possible to reduce a coupling capacitance if the relative dielectric constant $\epsilon$ of the insulating material is reduced. It is therefore attempted to use materials with a low relative dielectric constant $\epsilon$ (known as "low-k materials") as materials for insulation layers in integrated circuits.

Amorphous silicon dioxide ($SiO_2$) with a relative dielectric constant of approximately 4.0 is often used as dielectric for electrically insulating metallic interconnects from one another. It is possible to further reduce the dielectric constant of a material for an electrically insulating layer if silicon oxide material which additionally contains fluorine, hydrogen or alkyl groups (in particular CH groups) is used for this purpose. This makes it possible to reduce the relative dielectric constant to as little as 2.5. Furthermore, organic materials, in particular polymers, such as for example SiLK™ (a dielectric produced by The Dow Chemical Company and marketed under the abovementioned trade name) or PBO (polybenzoxazole), are used, making it possible to achieve relative dielectric constants of 2.7. It is also possible for the "low-k materials" used to be materials based on silicon, such as for example a silicon-oxygen-fluorine compound, a silicon-carbon-oxygen-hydrogen compound, hydrogen silsesquioxane (HSQ) or methyl silsesquioxane (MSQ).

The relative dielectric constant of electrically insulating layers can be reduced further by introducing cavities into the "low-k material". The k value of the porous material is reduced further as a function of the proportion of the volume formed by the cavities or pores.

Figure 1A:
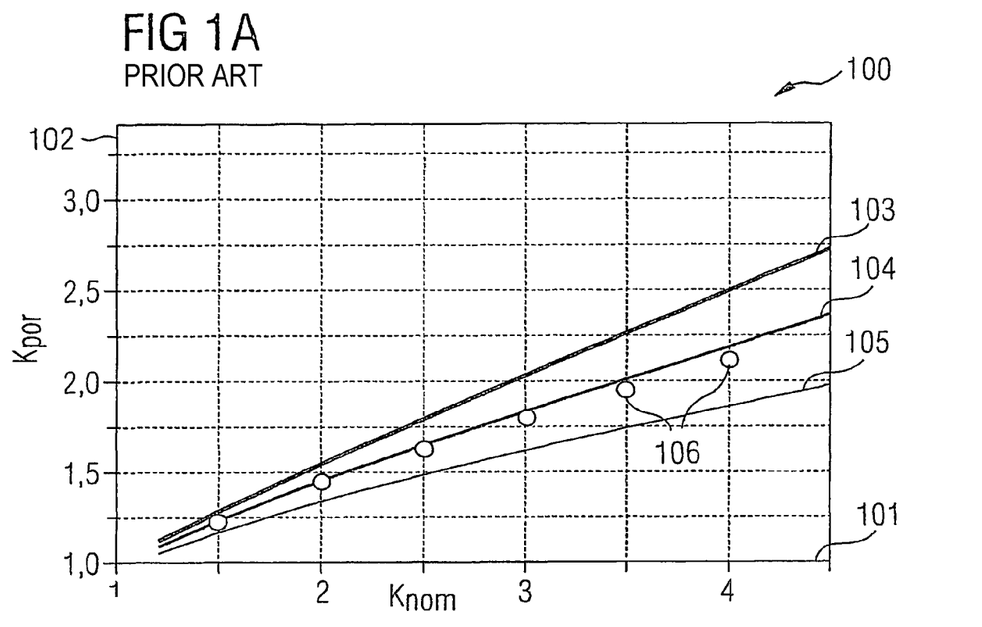
FIG. 1A illustrates a diagram plotting the dependent relationship between the k value in a porous material and the k value in the associated homogenous material.

FIG. 1A illustrates a diagram 100 which is known from Steinhögl, W, Schindler, G (2001) "Towards Minimum k Values of Porous Dielectrics: A Simulation Study", Advanced Metallization Conference, Oct. 9-11, 2001, Montreal. The k value $k_{hom}$ of a homogenous material is plotted on the abscissa 101, and the associated k value $k_{por}$ which is obtained if pores are introduced into the homogenous material is plotted on the ordinate 102. A first curve 103 shows the dependent relationship described if the cavities form 40% of the volume of the dielectric. A second curve 104 shows the dependent relationship described if the cavities form 50% of the volume of the dielectric, and a third curve 105 shows the dependent relationship if the cavities form 60% by volume of the dielectric. The curves 103 to 105 were obtained from model calculations calculated using effective medium approximation, an approximation method described in Aspnes, DE "Determination of Optical Properties by Ellipsometry" in "Handbook of Optical Constants of Solids", Academic Press, 1985, pp. 104ff. The diagram 100 also shows a number of data points 106 which were obtained by calculation with the cavities forming 50% by volume, by numerically solving the Maxwell equations using a finite element simulation. It can be seen from FIG. 1A that the higher the proportion of the volume formed by cavities, the greater the extent to which the k value $k_{por}$ in a porous material is reduced compared to the k value $k_{hom}$ in a homogenous material. A k value of 2.0 can be reached by introducing pores into the dielectric.

However, this method is unable to satisfy the demands imposed by the ITRS Roadmap ("International Technology Roadmap for Semiconductors") on the k value of an intermetal dielectric (IMD). ITRS is an institution which defines objectives for ensuring progress in integrated circuit technology. According to the ITRS Roadmap, in 2008 the demand will be for a k value of an intermetal dielectric of 1.5.

As illustrated in FIG. 1A, for an effective k value $k_{por}$, the host material, i.e. the homogenous, pore-free material, must have a k value $k_{hom}$ of approximately 2.1, working on the basis of the pores forming 50% by volume. A material of this type is not currently known for use in silicon process technology.

In particular, the concept of gradually increasing the proportion of a porous dielectric which is formed by cavities is limited by the fact that if this proportion by volume becomes too high, the mechanical stability of the dielectric layer deteriorates and the heat conduction properties, which are of relevance to the dissipation of losses caused by resistance in interconnects, also deteriorate. Therefore, to achieve a sufficiently low k value, the solution of increasing the proportion of cavities to an ever greater extent is reaching its limits.

Figure 1B:
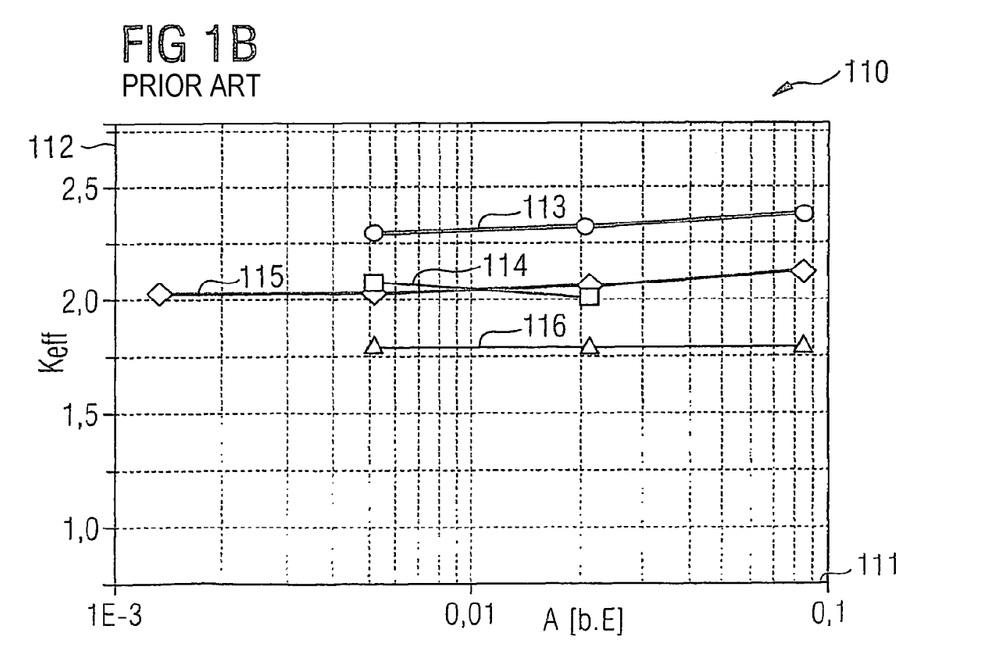
FIG. 1B illustrates a diagram plotting the dependent relationship between the effective k value of a porous dielectric and the geometry of the pores and the cross-sectional area of the pores.

The dependent relationship between the effective k value $k_{eff}$ and the pore cross-sectional area is shown in a semi-logarithmic illustration for different pore shapes and pore geometries in the diagram 110 shown in FIG. 1B.

The pore cross-sectional area is plotted in logarithmic form on an abscissa 111, and the effective k value $k_{eff}$ is plotted on the ordinate 112. A first curve 113, a second curve 114, a third curve 115 and a fourth curve 116, which run through the corresponding data points, are plotted in the diagram 110. In all cases, the pores are assumed to form 50% by volume, and the host material is assumed to be silicon dioxide with a (homogenous) k value of 4.0.

The second curve 114 corresponds to the case of pores with a circular cross section, the third curve 115 corresponds to pores with a square cross-sectional area. The first curve 113 and the fourth curve 116 show the dependent relationship for a pore with a rectangular cross-sectional area, which in the case of the first curve 113 is oriented parallel to an external electrical field and in the case of the fourth curve 116 is oriented perpendicular to an external electrical field.

The simulation calculations which are described and known from Steinhögl, W, Schindler, G (2001) "Towards Minimum k Values of Porous Dielectrics: A Simulation Study", Advanced Metallization Conference, Oct. 9-11, 2001, Montreal demonstrate that the effective k value decreases to a greater extent with the pores oriented perpendicular to an electric field than in the case of a parallel orientation between the direction in which the pores run and the electric field vector.

In other words, if elongate and oriented pores are used, it is possible to significantly reduce the effective k value $k_{eff}$ without increasing the proportion of the volume which is made up of the pores. With the same proportion of pores by volume, a reduction of 13% is achieved with a pore aspect ratio of 4:1, and a reduction of 20% is achieved with a pore aspect ratio of 24:1. If the pores are randomly oriented, there is no advantage over round pores (aspect ratio 1:1). In this case, the same mean k value is obtained.

However, the formation of oriented pores in a dielectric with cross-sectional areas sufficiently small for preferably a multiplicity of such pores to be arranged between adjacent interconnects of an integrated circuit, which are typically arranged at a distance F from one another, imposes considerable technological demands. In this context, F denotes the minimum feature sizes that can usually be achieved using a specific technology.

The following process for producing a porous dielectric is known from the prior art. Two liquid components, of which one is dielectric in the solidified state and the other is, for example, a pore-forming agent, are mixed and brought to an elevated temperature at which only the first component solidifies, and in so doing encloses liquid pore-forming agent. If the inclusions of pore-forming agent are converted into the gas phase, what remains is a porous dielectric.

However, the process described cannot be used to produce oriented pores, which have particularly advantageous properties (cf. FIG. 1B), and the process is limited to dielectrics which are in a settable liquid phase.

U.S. Pat. No. 5,461,003 discloses a process for forming air gaps between the metal lines of a semiconductor device.

EP 1 061 043 A1 describes a low-temperature process for synthesizing carbon nanotubes using a metal catalyst layer for decomposing a carbon source gas.

U.S. 2001/0024633 A1 discloses a process for the vertical alignment of carbon nanotubes on substrates at low pressure and low temperature using a CVD process.

U.S. Pat. No. 6,277,318 B1 discloses a process for producing structured carbon nanotube films.

SUMMARY

The invention is based on the problem of introducing elongate, oriented pores into a dielectric in order thereby to reduce the effective k value of a dielectric.

The problem is solved by a process for producing a layer arrangement and by a layer arrangement having the features described in the independent patent claims.

In one embodiment, the invention provides a process for producing a layer arrangement, in which two electrically conductive interconnects running substantially parallel to one another are formed on a substrate, at least one auxiliary structure is formed on the substrate and between the two interconnects, running in a first direction, which first direction includes an acute or right angle of at least 45° with a connecting axis of the interconnects, running orthogonally with respect to the two interconnects, the at least one auxiliary structure being produced from a material which allows the at least one auxiliary structure to be selectively removed from the dielectric layer and in which process, a dielectric layer is formed between the two interconnects, in such a manner that the at least one auxiliary structure is at least partially covered by the dielectric layer.

Evidently, at least one auxiliary structure is formed at a predeterminable direction on the substrate and between interconnects arranged on the substrate, and this at least one auxiliary structure is at least partially covered by a dielectric layer. Furthermore, the selectivity with which the auxiliary structures can be removed with respect to the dielectric layer is utilized; this selectivity results from the material used for the auxiliary structure. In other words, the auxiliary structures (which are evidently sacrificial structures) can be removed after application of the dielectric layer, so that oriented pores then remain in the dielectric layer at the locations at which the auxiliary structures were previously arranged. As has been described above with reference to FIG. 1B, by suitably selecting the orientation (corresponding to the angle between the connecting axis of the interconnects and the direction in which the auxiliary structures run in accordance with the invention), it is possible to reduce the effective k value of the dielectric layer and thereby to produce a "low-k dielectric". Conversely, given a predetermined set value for the relative dielectric constant for a predetermined host material, it is possible to reduce the proportion by volume of pores in the dielectric layer, thereby ensuring sufficient dissipation of waste heat produced by resistance losses and a sufficient mechanical stability of the porous dielectric layer. The dissipation of heat from a tube structure of this type is particularly expedient, since the heat conduction parallel to the tubes is higher than perpendicular thereto. This allows the transfer of heat toward the top surface and the back surface of the substrate to be improved. The result is a very effective dissipation of the thermal power loss produced in the interconnects. Furthermore, all the process steps mentioned can be realized using tried-and-tested standard semiconductor technology processes which are available in numerous semiconductor technology laboratories and factories and can be carried out at low cost. It is particularly advantageous that the auxiliary or sacrificial structures can be removed without destroying or damaging the dielectric.

The invention makes use of the physical discovery that elongate pores with an orientation that is preferably perpendicular to the two interconnects and therefore perpendicular to the electric field lines of an electric field between the two parallel interconnects allow the k value to be reduced by 15% or more. Therefore, an oriented tube structure of this type can be used as "low-k dielectric" in an insulating material.

By way of example, with the process according to the invention it is possible to produce a tubular structure by free-standing, oriented auxiliary structures, for example carbon nanotubes, being deposited on the substrate, dielectric material being deposited conformally on the auxiliary structures and then the auxiliary structures being converted into the gas phase without the dielectric material being destroyed. In the case of carbon nanotubes, for example, it is possible to incinerate or burn the carbon nanotubes in an oxygen-containing atmosphere at a sufficiently high temperature, so that they are oxidized to form carbon dioxide.

Furthermore, the invention provides a layer arrangement, having a substrate, two electrically conductive interconnects running substantially parallel to one another on the substrate, a dielectric layer between the two interconnects and at least one auxiliary structure, which extends in a first direction starting from the surface of the substrate, at least partially in the dielectric layer and between the two interconnects, which first direction includes an acute or right angle of at least 45° (degrees) with a connecting axis of the interconnects running orthogonally with respect to the two interconnects, the at least one auxiliary structure being produced from a material which allows the at least one auxiliary structure to be selectively removed from the dielectric layer.

Preferred refinements of the invention will emerge from the dependent claims.

In the process according to the invention, a layer of catalyst material for catalyzing the formation of the auxiliary structure can be formed between at least part of the substrate and the at least one auxiliary structure.

By forming a layer of catalyst material, it is possible for the auxiliary structures to be applied in targeted positions and under more gentle conditions (e.g. at a lower temperature) than if a layer of catalyst material is not used. This simplifies and improves the production process.

Furthermore, an electrically insulating auxiliary layer, which may be produced in particular from silicon dioxide or silicon nitride, may be formed between the layer of catalyst material and the substrate.

According to an advantageous refinement, at least one of the at least one auxiliary structures can be selectively removed from the dielectric layer.

As a result, oriented pores remain in the dielectric layer, thereby producing the advantageous effects which have been described above.

In particular, according to the process of the invention, it is possible for at least one of the at least one auxiliary structures to be formed as a carbon nanotube, and for the at least one carbon nanotube to be selectively removed in a dielectric layer by increasing the temperature in an oxygen atmosphere.

A carbon nanotube is particularly suitable for use as auxiliary structure. By way of example, Harris, P J F (1999) "Carbon Nanotubes and Related Structures—New Materials for the Twenty-first Century.", Cambridge University Press, Cambridge. pp. 1 to 15, 111 to 155 provides an overview of carbon nanotubes. A nanotube is a single-walled or multi-walled, tubular carbon compound. In the case of multi-walled nanotubes, at least one inner nanotube is coaxially surrounded by an outer nanotube. Single-walled nanotubes typically have diameters of 1 nm, and the length of a nanotube may be several 100 nm. The ends of a nanotube are often terminated with in each case half a fullerene molecule. Processes for producing carbon nanotubes on a substrate are described, for example, in Xu, X et al. (1999) "A method for fabricating large-area, patterned, carbon nanotube field emitters" Applied Physics Letters 74(17):2549-2551, Ren, Z F et al. (1999) "Growth of a single freestanding multiwall carbon nanotube on each nanonickel dot" Applied Physics Letters 75(8):1086-1088. The CVD (chemical vapor deposition) process is often used for this purpose.

Carbon nanotubes can be formed on the surface of the substrate in the manner described and conformally covered with a dielectric layer. Use is then made of the selectivity with which the carbon nanotubes and the dielectric can be removed. In an oxygen plasma, the carbon nanotubes are burnt to form carbon dioxide, whereas the dielectric layer is not removed by an oxygen plasma. Therefore, what remains is a dielectric layer with structured nanopores, which can be used as a low-k material.

According to another refinement of the process according to the invention for producing a layer arrangement, the dielectric layer is formed before the interconnects, and the interconnects are formed using the Damascene process in the dielectric layer.

Alternatively, the dielectric layer may be formed after the interconnects.

The layer arrangement produced in accordance with the invention is described in more detail in the text which follows. Configurations relating to the layer arrangement also apply to the process for producing a layer arrangement, and vice versa.

In the layer arrangement according to the invention, it is preferable for the angle included between the first direction and the connecting axis to be 90 degrees.

It is particularly expedient to produce tubular pores with an orientation perpendicular to the surface of the substrate, since this particularly greatly reduces the coupling capacitance between the interconnects of a metallization level with a given proportion of the volume formed by the pores.

It is preferable for the substrate to be a silicon substrate.

The dielectric layer may include silicon dioxide ($SiO_2$), silicon oxide with fluorine, hydrogen, carbon and/or alkyl groups (in particular CH groups), SiLK™, parylene, benzocyclobutene (BCB), polybenzoxazole (PBO), hydrogen silsesquioxane (HSQ) or methyl silsesquioxane (MSQ).

The at least one auxiliary structure may be a nanotube, a nanorod or a polymer.

However, it is also possible for any other suitable structure, for example carbon fibers or other fibers of sufficiently small dimensions which can be applied in oriented fashion to a substrate, to be used as the auxiliary structure.

If at least one of the at least one auxiliary structures is formed as a nanorod, this nanorod may include silicon, germanium, indium phosphide and/or gallium arsenide. If at least one of the at least one auxiliary structures is a nanotube, this may, for example, be a carbon nanotube, a tungsten sulfide nanotube or another chalcogenide nanotube. In the case of a carbon nanotube, this may be a pure carbon nanotube or a carbon nanotube with at least one further element, such as for example a carbon-nitrogen nanotube or a carbon-boron-nitrogen nanotube.

The nanostructures described are described, for example, in Roth, S (200)"Leuchtdioden aus Nanostäbchen", [light-emitting diodes formed from nanorods], Physikalische Blätter 57(5):17f. In addition to carbon nanotubes, by way of example nanotubes made from tungsten sulfide and other chalcogenides are also known. Furthermore, in addition to the hollow nanotubes, nanorods are also being investigated. Like nanotubes, nanorods have a diameter in the nanometer range, but may be up to a few micrometers long. In this case, they are molecule-like in cross section but compatible with current semiconductor technology over their length. Typical materials used for nanorods are the semiconductors silicon, germanium, indium phosphide and gallium arsenide. Like the carbon nanotubes, the nanorods can also be deposited from the vapor phase using catalytic processes.

According to a refinement of the layer arrangement according to the invention, a layer of catalyst material for catalyzing the formation of the auxiliary structure may be arranged between at least part of the substrate and the at least one auxiliary structure.

The layer of catalyst material may in particular have a plurality of noncohesive sections on the surface of the substrate. The auxiliary structure then grows preferentially on such spots, whereas regions on the surface of the substrate which do not have catalyst material remain free of auxiliary structures.

If, in the layer arrangement, at least one of the at least one auxiliary structures is a carbon nanotube, a layer which includes iron, cobalt and/or nickel is particularly advantageous for use as the layer of catalyst material.

In particular, it is known that spots of a layer of catalyst material of this type on the surface of a substrate form regions from which the growth of the carbon nanotubes in a growth direction orthogonal with respect to the substrate proceeds particularly effectively.

It is preferable for at least one of the at least one auxiliary structures to have a substantially circular or rectangular cross section in a plane that is orthogonal to the first direction.

The surface plane of the substrate may in particular run orthogonally or parallel to the first direction, i.e. the auxiliary structures may be oriented in the substrate surface or perpendicular with respect thereto.

An electrically insulating interlayer may be arranged between the layer of catalyst material and the substrate.

Furthermore, at least one of the interconnects may be at least partially surrounded by a barrier layer, in order to avoid diffusion.

It is possible that undesirable diffusion may take place between an interconnect, which is often made from copper material, and an adjoining insulation layer, which is often formed from silicon dioxide. This ion diffusion has undesirable effects and can be avoided by at least partially surrounding the interconnects with a barrier layer, which may be produced in particular from tantalum and/or tantalum nitride.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 2A:
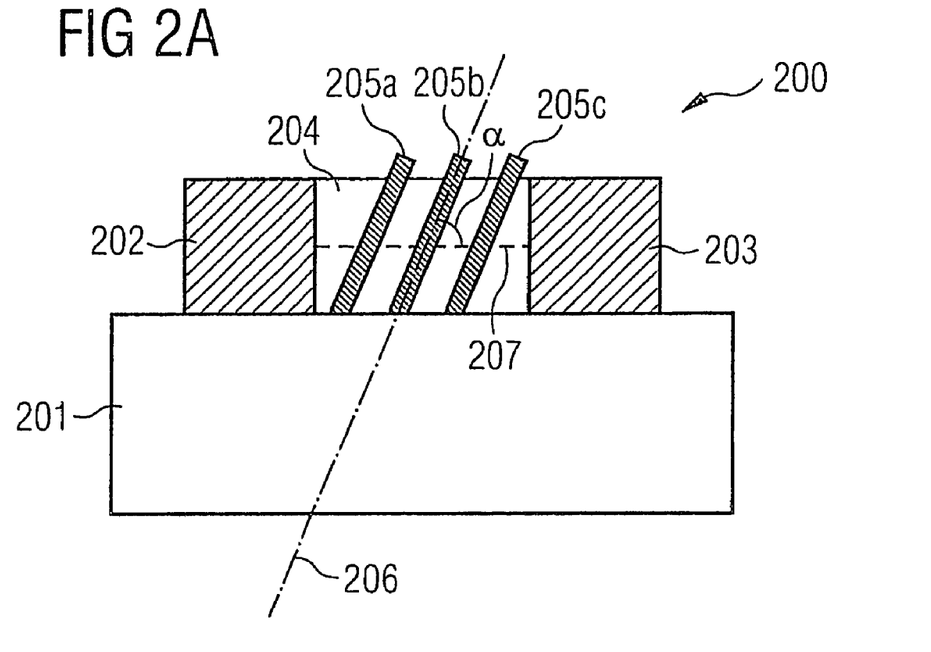
FIG. 2A illustrates a layer arrangement according to a first exemplary embodiment of the invention in a first operating state.

The following text, referring to FIG. 2A, describes a layer arrangement 200 in accordance with a first exemplary embodiment of the invention.

The layer arrangement 200 includes a silicon substrate 201, two copper interconnects 202, 203 running parallel to one another on the silicon substrate 201, a silicon dioxide dielectric layer 204 between the two interconnects 202, 203 and three carbon nanotubes 205a, 205b, 205c, extending in a first direction 206 from the surface of the silicon substrate 201, at least partially in the silicon dioxide dielectric layer 204 and between the two interconnects 202, 203, which first direction 206 includes an acute angle α>45° with a connecting axis 207 of the interconnects 202, 203, which runs orthogonally with respect to the two interconnects 202, 203, with the carbon nanotubes 205a, 205b, 205c, which include carbon material, being directed in such a manner that the three carbon nanotubes 205a to 205c can be removed selectively from the silicon dioxide dielectric layer 204.

Figure 2B:
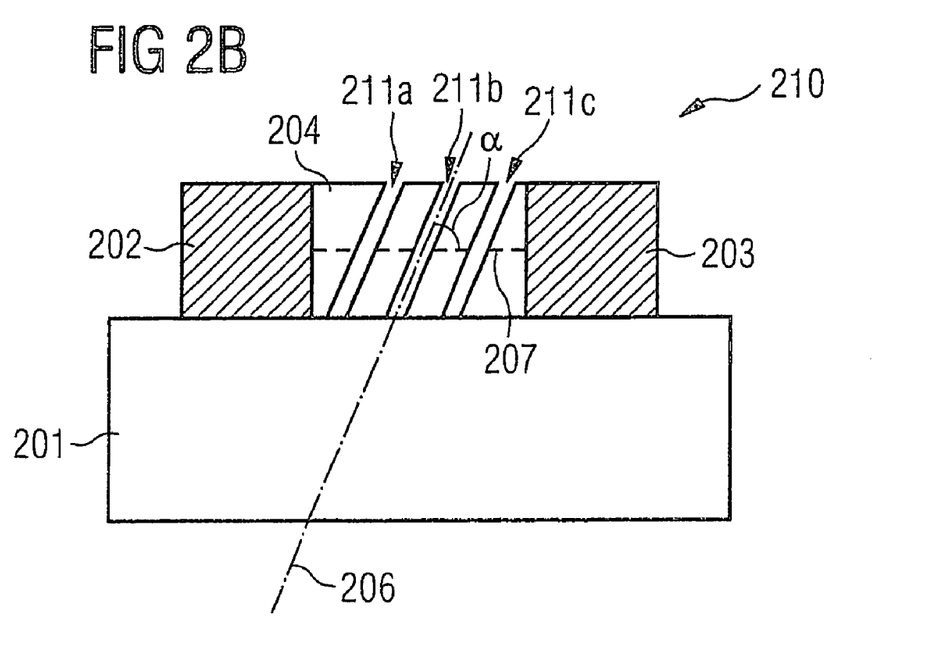
FIG. 2B illustrates the layer arrangement according to the first exemplary embodiment of the invention as shown in FIG. 2A in a second operating state.

FIG. 2B illustrates a layer arrangement 210 which has been modified with respect to the layer arrangement 200 shown in FIG. 2A. Identical components in FIG. 2B are provided with the same reference numerals as in FIG. 2A.

As shown in FIG. 2B, the carbon nanotubes 205a to 205c have been removed from the layer arrangement 210, whereas the silicon dioxide dielectric layer 204 has not been removed from the layer arrangement 210, so that what remains is a first tube 211a, a second tube 211b and a third tube 211c. A porous dielectric which includes tubular cavities which are oriented at an angle α>45° with respect to an electric field between the two interconnects 202, 203 (an electric field of this type is not shown in FIG. 2B), has been formed from the tubes (or pores) 211a to 211c and the silicon dioxide dielectric layer 204, so that the silicon dioxide dielectric layer 204 with the tubes 211a to 211c has a lower dielectric constant than in the operating state with carbon nanotubes 205a to 205c shown in FIG. 2A.

The following text, referring to FIG. 3A to FIG. 3G, describes a process for producing a layer arrangement in accordance with a first exemplary embodiment of the invention.

Figure 3A:
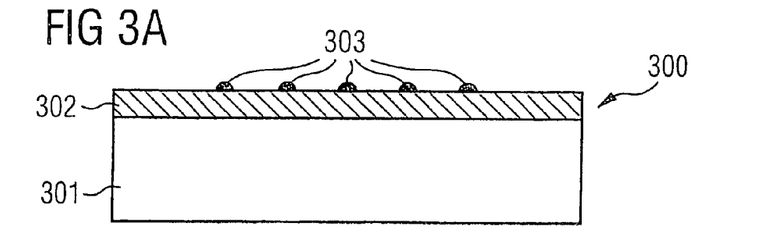
FIGS. 3A to 3G illustrate layer sequences at different times during the process according to the invention for producing a layer arrangement in accordance with a first exemplary embodiment of the invention.

FIG. 3A illustrated a layer sequence 300 as obtained at a first time during the production process according to the invention. The layer sequence 300 is obtained by an electrically insulating interlayer 302 of silicon nitride being applied to a silicon substrate 301, and by catalyst material for catalyzing the formation of carbon nanotubes being applied to part of the electrically insulating layer 302. According to the exemplary embodiment described, the layer of catalyst material encompasses the catalyst material spots 303. The thickness of the catalyst material spots 303 is approximately 1 to 5 nm, and these catalyst material spots are produced from iron, nickel and cobalt. In a subsequent process step, they serve as nuclei for the growth of carbon nanotubes. The electrically insulating interlayer 302 is an approximately 5 nm thick silicon nitride layer.

Figure 3B:
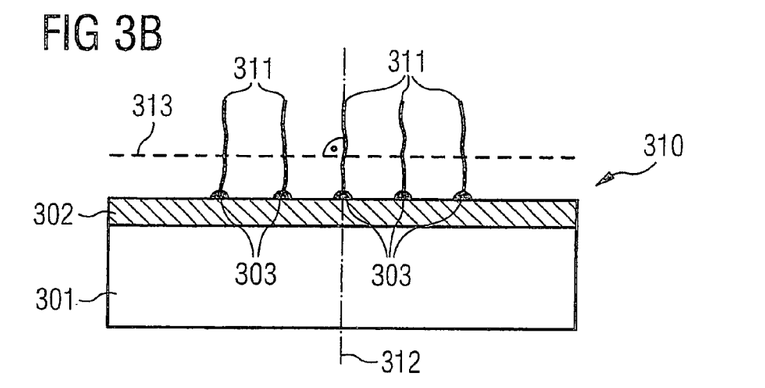

The layer sequence 310 illustrated in FIG. 3B is obtained by five carbon nanotubes 311 being formed on the surface of the layer sequence 300, more specifically on the catalyst material spots 303, and on a surface region of the layer sequence 300 between two interconnects which are to be applied in a subsequent process step, which carbon nanotubes 311 run in a first direction 312, which first direction 312 forms a right angle with a connecting axis 313 running orthogonally with respect to the two interconnects which are subsequently to be formed. The carbon nanotubes 311 are produced from carbon material, so that the carbon nanotubes 311 can be removed selectively from a dielectric layer formed in a subsequent process step. According to the exemplary embodiment of the invention described, the carbon nanotubes 311 are formed using a CVD (chemical vapor deposition) process, in which the layer sequence 300 is exposed to a hydrogen atmosphere at a temperature of between 400° C. and 750° C. for approximately 5 minutes, and then acetylene is introduced in the process chamber as a carbon source for approximately 2 to 10 minutes. With this process, it is possible to produce carbon nanotubes 311 which are approximately 10·m long and which, as shown in FIG. 3B, are arranged perpendicularly on the planar surface of the layer sequence 310.

It should be noted that the invention is not restricted to the scenario illustrated in FIG. 3B, in which in each case one carbon nanotube is grown on each catalyst spot. If the process parameters (e.g., size of the catalyst material spots, etc.) are selected accordingly, it is possible for a plurality of carbon nanotubes, for example a tuft of carbon nanotubes, to be grown on one catalyst material spot.

Figure 3C:
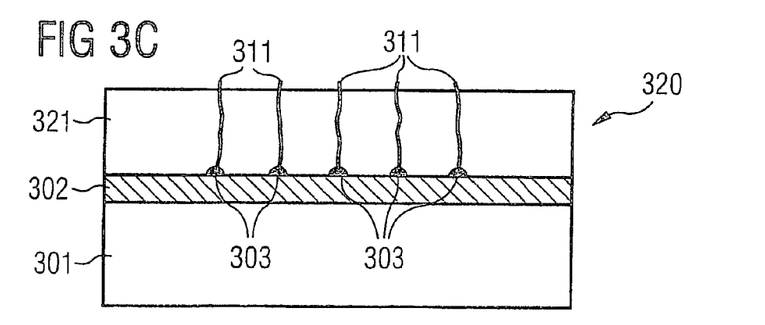

The layer sequence 320 illustrated in FIG. 3C is obtained by a dielectric layer 321 being formed in a region between the two interconnects which are to be formed in a subsequent process step, in such a manner that the carbon nanotubes 311 are partially covered by the dielectric layer 321 of silicon dioxide material. The dielectric layer 321 is formed using a CVD process. Alternatively, the material of the dielectric layer 321 may be silicon nitride or what is known as a spin-on glass. A spin-on glass is produced by spinning on liquid glasses, for example formed from dissolved siloxenes, spin-on glass being applied to a layer sequence by means of spin-on coating in a similar manner to resist, flowing at room temperature and thereby filling up trenches at the surface and leveling any steps.

Figure 3D:
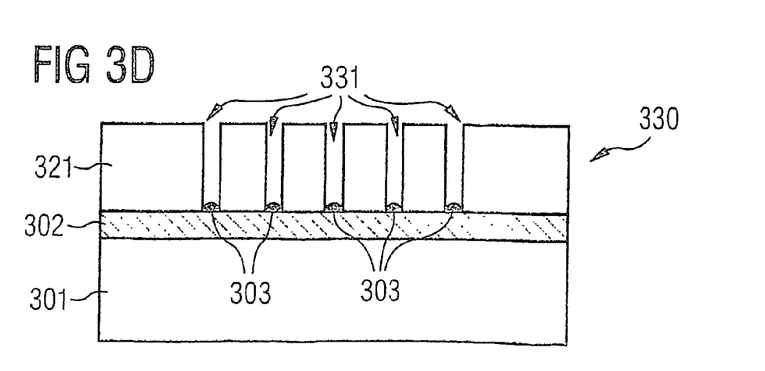

The layer sequence 330 illustrated in FIG. 3D is obtained by the carbon nanotubes 311 being removed selectively from the dielectric layer 321. The carbon nanotubes 311 are removed selectively from the dielectric layer 321 by increasing the temperature in an oxygen atmosphere. As a result, what remains are tubular, oriented pores 331 in the layer sequence 330. The carbon nanotubes 311 enclosed in the dielectric layer 321 (optionally after the dielectric layer 321 has been etched back in a scenario which deviates from FIG. 3C and in which the carbon nanotubes 311 are completely covered by the dielectric layer 321) are evidently incinerated by means of an oxygen plasma, so that what remains is a dielectric layer 321 studded with the tube-like pores 331.

According to the exemplary embodiment of the process for producing a layer arrangement described, the dielectric layer 321 is formed before the interconnects, and the interconnects are formed using the Damascene process in the dielectric layer 321, as described below.

In the Damascene technique for producing leveled interconnects, first of all an intermetal dielectric is applied to a layer, trenches are etched into this intermetal dielectric and these trenches are filled with metal. For this purpose, the metal is first of all deposited over the entire surface and then removed again, for example by CMP (chemical mechanical polishing) or by etching back exposed regions.

Figure 3E:
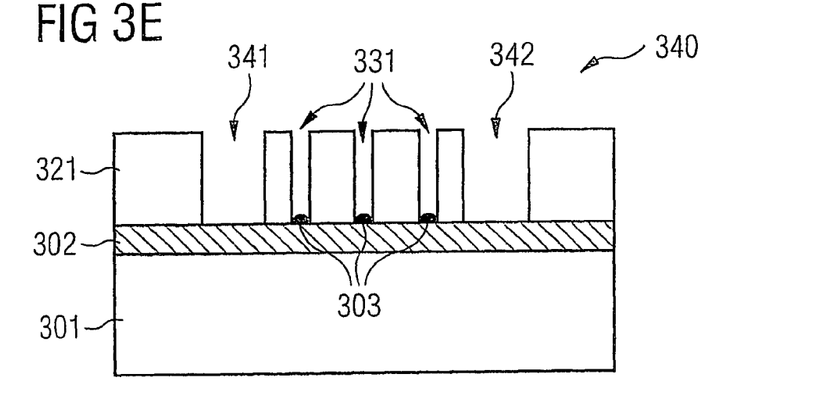

To obtain the layer sequence 340 illustrated in FIG. 3E, trenches 341, 342 are introduced into the surface of the layer sequence 330 in surface regions in which the interconnects are formed in a subsequent process step. This is realized by means of a suitable lithography and dry-etching process.

Figure 3F:
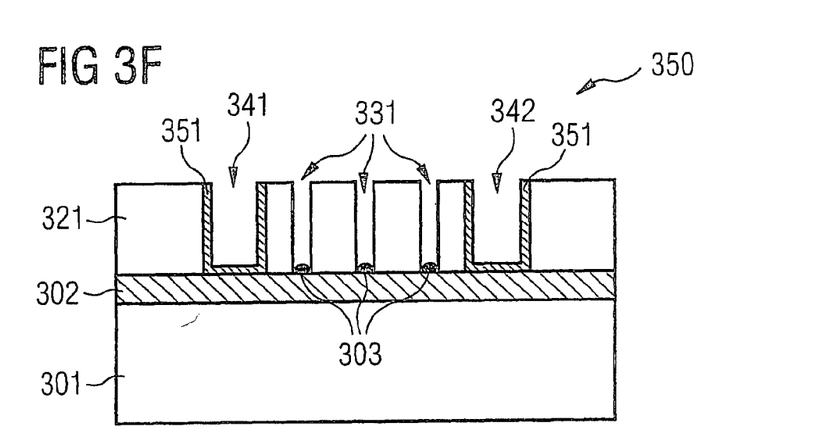

The layer sequence 350 illustrated in FIG. 3F is obtained by the first trench 341 and the second trench 342 being lined with a barrier layer 351 of tantalum nitride. The barrier layer 351 of tantalum nitride prevents copper material from the interconnects that are subsequently formed from diffusing into the dielectric layer 321.

Figure 3G:
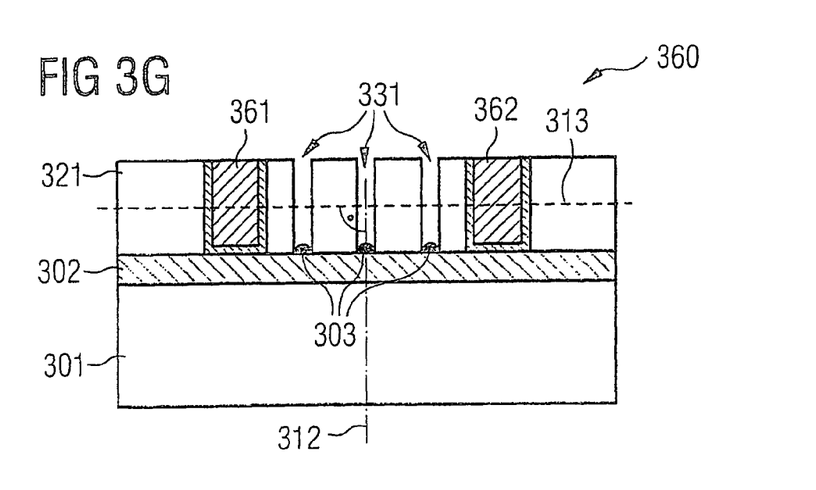

To obtain the layer arrangement 360 according to the invention illustrated in FIG. 3G, the first and second trenches 341, 342, which have been lined with the barrier layer 351 of tantalum, are filled with copper material. This forms the first and second interconnects 361, 362. This is realized by first of all applying a copper seed layer, i.e. a thin film of copper, to the barrier layers 351 in the trenches 341, 342, which copper seed layer ensures that copper material which is subsequently applied is applied to the regions within the trench which are defined by the copper seed layer. The filling of the trenches 341, 342 lined with the barrier layer 351 and the copper seed layer (not illustrated in FIG. 3G) is carried out using an electroplating process.

The result is the layer arrangement 360 illustrated in FIG. 3G. In this layer arrangement, the first direction 312 is oriented orthogonally with respect to the connecting axis 313 of the first and second interconnects 361, 362 and therefore orthogonally with respect to an electric field generated by electric charge carriers on the interconnects 361, 362, resulting in a material with a particularly low dielectric constant (cf. FIG. 1B).

The text which follows, referring to FIG. 4A to FIG. 4G, describes a process for producing a layer arrangement in accordance with a second preferred exemplary embodiment of the invention.

According to this exemplary embodiment of the production process according to the invention, the dielectric layer is formed after the interconnects.

Figure 4A:
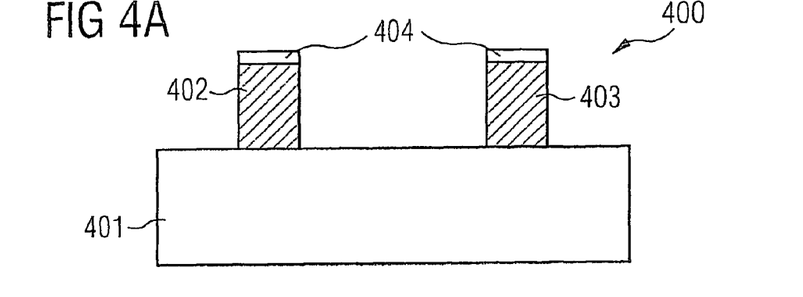
FIGS. 4A to 4G illustrate layer sequences at different times during the process for producing a layer arrangement in accordance with a second exemplary embodiment of the invention.

To obtain the layer sequence 400 shown in FIG. 4A, two electrically conductive interconnects 402, 403 running parallel to one another are formed on a silicon substrate 401. Furthermore, FIG. 4A illustrates a photoresist part-layer 404 on the interconnects 402, 403, originating from a patterning process used to form the interconnects 402, 403 from an electrically conductive layer.

Figure 4B:
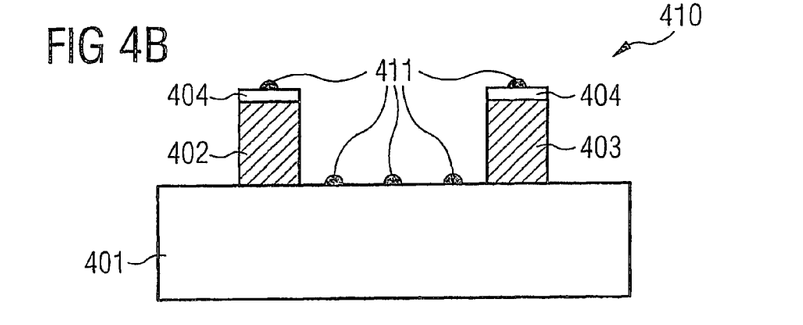

The layer sequence 410 illustrated in FIG. 4B is obtained by catalyst material spots 411 for catalyzing the formation of an auxiliary structure in a subsequent process step being formed on part of the silicon substrate 401. As illustrated in FIG. 4B, some of the catalyst material spots 411 are formed on the photoresist part-layer 404.

Figure 4C:
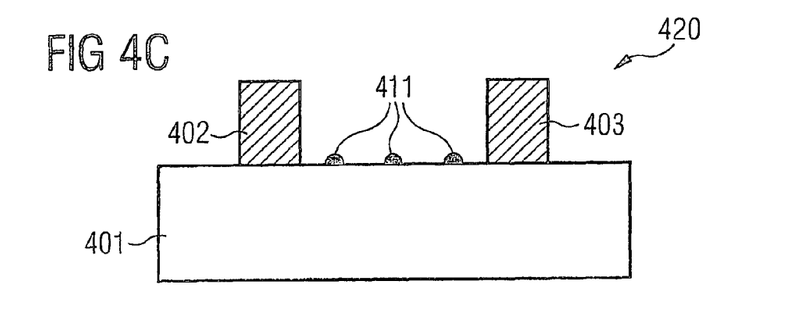

The layer sequence 420 illustrated in FIG. 4C is obtained by removing the photoresist part-layer 404 from the interconnects 402, 403 using a lift-off process. As a result, those catalyst material spots 411 which were applied to the photoresist part-layers 404 are removed from the layer sequence 410.

Figure 4D:
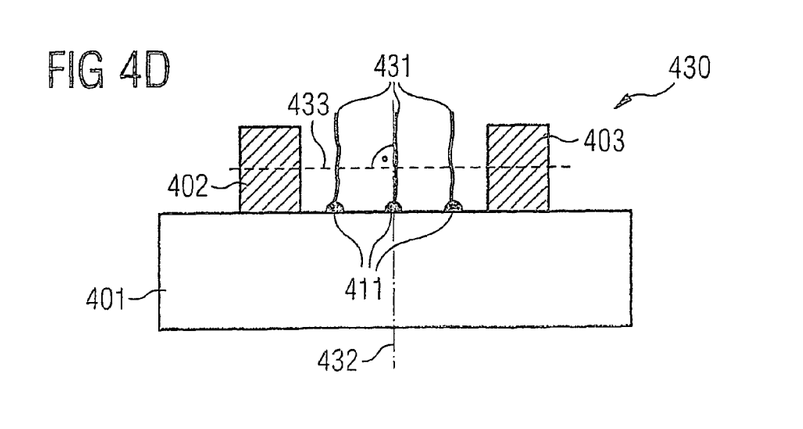

To obtain the layer sequence 430 illustrated in FIG. 4D, three carbon nanotubes 431 are formed on the silicon substrate 401 and between the two interconnects 402, 403, running in a vertical direction 432 as shown in FIG. 4D, which vertical direction 432 substantially includes a right angle with a connecting axis 433 running orthogonally with respect to the two interconnects 402, 403, the carbon nanotubes 431 including carbon material, so that the carbon nanotubes 431 can be removed selectively from a dielectric layer that is to be applied in a further process step. The connecting axis 433 runs in the horizontal direction in accordance with FIG. 4D.

Figure 4E:
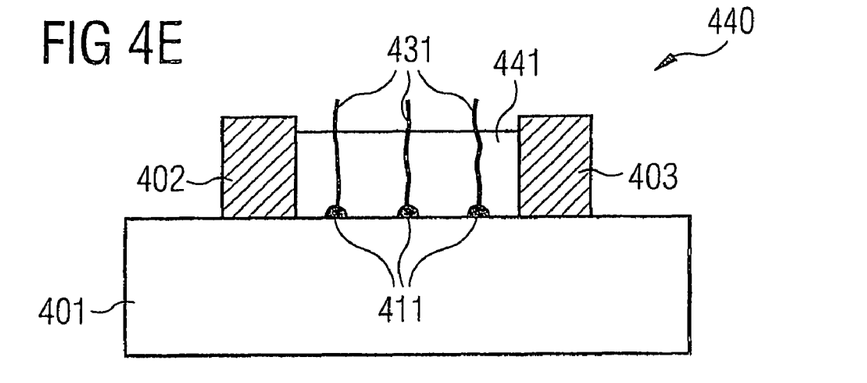

To obtain the layer sequence 440 illustrated in FIG. 4E, a dielectric silicon dioxide layer 441 is formed between the two interconnects 402, 403, in such a manner that the carbon nanotubes 431 are partially covered by the dielectric silicon dioxide layer 441. This is realized using a CVD process.

Figure 4F:
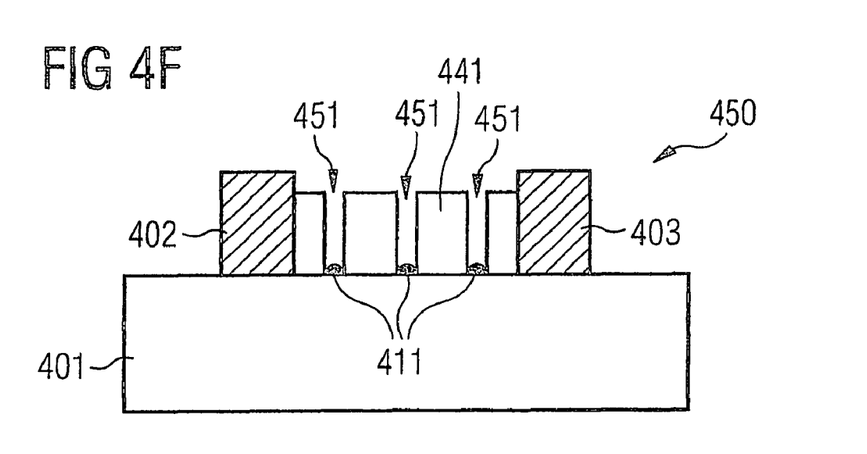

To obtain the layer sequence 450 illustrated in FIG. 4F, the carbon nanotubes 431 are removed selectively from the dielectric silicon dioxide layer 441 by the carbon nanotubes 431 being removed selectively from the dielectric silicon dioxide layer 441 as a result of the temperature being increased in an oxygen atmosphere. The material of the carbon nanotubes 431 is incinerated as a result, so that trenches (or pores) 451 remain in the dielectric silicon dioxide layer 441.

Figure 4G:
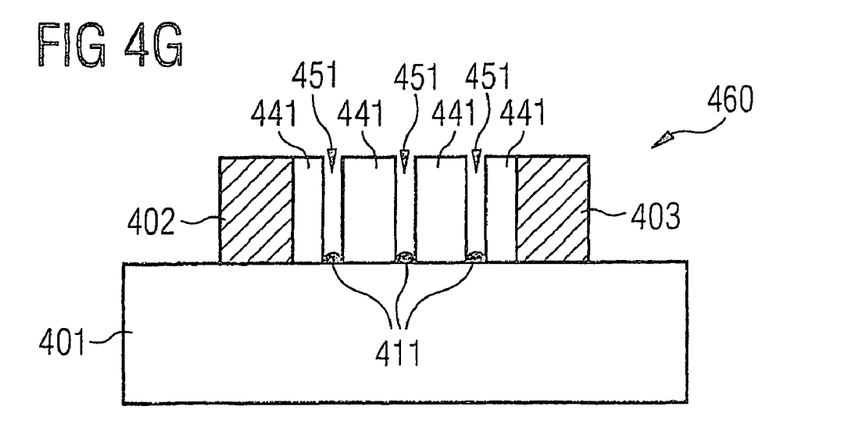

To obtain the layer arrangement 460 illustrated in FIG. 4G, the layer sequence 450 is treated with a CMP process in order to obtain a planar surface.

The invention claimed is:

1. A process for producing a circuit arrangement having a layer arrangement, in which two electrically conductive interconnects running substantially parallel to one another are formed on a substrate, comprising;
    forming at least one auxiliary structure on the substrate and between the two interconnects, running in a first direction, which first direction includes an angle of between 45 degrees and 90 degrees with a connecting axis of the interconnects, running orthogonally with respect to the two interconnects, the at least one auxiliary structure being produced from a material which allows the at least one auxiliary structure to be selectively removed from a dielectric layer;
    forming the dielectric layer between the two interconnects, in such a manner that the at least one auxiliary structure is at least partially covered by the dielectric layer; and
    forming a layer of catalyst material for catalyzing the formation of the auxiliary structure between at least part of the substrate and the at least one auxiliary structure.

2. The process of claim 1, comprising forming an electrically insulating interlayer between the layer of catalyst material and the substrate.

3. The process of claim 1, comprising selectively removing at least one of the at least one auxiliary structures from the dielectric layer.

4. A process for producing a circuit arrangement having a layer arrangement, in which two electrically conductive interconnects running substantially parallel to one another are formed on a substrate, comprising:
    forming at least one auxiliary structure on the substrate and between the two interconnects, running in a first direction, which first direction includes an angle of between 45 degrees and 90 degrees with a connecting axis of the interconnects, running orthogonally with respect to the two interconnects, the at least one auxiliary structure being produced from a material which allows the at least one auxiliary structure to be selectively removed from a dielectric layer;
    forming the dielectric layer between the two interconnects, in such a manner that the at least one auxiliary structure is at least partially covered by the dielectric layer;
    selectively removing at least one of the at least one auxiliary structures from the dielectric layer;
    forming at least one of the at least one auxiliary structures as a carbon nanotube; and
    selectively removing the at least one carbon nanotube from the dielectric layer by increasing the temperature in an oxygen atmosphere.

5. The process of claim 1, comprising:
    forming the dielectric layer before the interconnects; and
    forming the interconnects using the Damascene process in the dielectric layer.

6. The process of claim 1, comprising forming the dielectric layer after the interconnects.

7. An arrangement having a dielectric layer and electrically conductive interconnects comprising:
    a substrate;
    two electrically conductive interconnects running substantially parallel to one another on the substrate;
    a dielectric layer between the two electrically conductive interconnects, the dielectric layer comprising elongated nanopores; and
    free-standing oriented sacrificial structures in the elongated nanopores, wherein the free-standing oriented sacrificial structures extend along a longitudinal axis from the surface of the substrate, at least partially in the elongated nanopores of the dielectric layer and between the two interconnects, the longitudinal axis including an angle of between 45 degrees and 90 degrees with a connecting axis of the interconnects running orthogonally with respect to the two interconnects.

8. The arrangement of claim 7, in which the angle included between the longitudinal axis and the connecting axis is 90 degrees.

9. The arrangement of claim 7, in which the substrate is a silicon substrate.

10. The arrangement of claim 7, in which the dielectric layer is selected from a group comprising:
    silicon dioxide;
    silicon oxide with fluorine, hydrogen, carbon and/or alkyl groups;
    Parylene;
    Benzocyclobutene;
    Polybenzoxazole;
    hydrogen silsesquioxane; or
    methyl silsesquioxane.

11. The arrangement of claim 7, in which a layer of catalyst material for catalyzing the formation of the sacrificial structures is arranged between at least part of the substrate and the sacrificial structure.

12. The arrangement of claim 11, in which at least one of the elongate nanopores comprises:
    a nanotube;
    a nanorod; or
    a polymer.

13. The arrangement of claim 12, in which the nanorod comprises:
Silicon;
Germanium;
indium phosphide; and/or
gallium arsenide.

14. The arrangement of claim 12, in which the nanotube comprises:
a carbon nanotube;
a tungsten sulfide nanotube; or
a chalcogenide nanotube.

15. The arrangement of claim 12, in which the sacrificial structures are carbon nanotubes, and in which the layer of catalyst material comprises iron, cobalt, and/or nickel.

16. The layer arrangement of claim 7, in which in which the sacrificial structures, in a plane orthogonal to the longitudinal axis, comprises a substantially circular or rectangular cross section.

17. The arrangement of claim 7, comprising in which a surface plane of the substrate runs orthogonally or parallel to the longitudinal axis.

18. The arrangement of claim 17, comprising in which an electrically insulating interlayer is arranged between the layer of catalyst material and the substrate.

19. The arrangement of claim 7, comprising in which at least one of the interconnects is at least partially surrounded by a barrier layer, in order to avoid diffusion.

20. The arrangement of claim 19, in which the barrier layer comprises tantalum, and/or tantalum nitride.

21. A process for producing a semiconductor arrangement, having a dielectric layer and electrically conductive interconnects, the process comprising:
forming two electrically conductive interconnects running substantially parallel to one another on a substrate;
forming free-standing, oriented sacrificial structures on the substrate and between the two interconnects, a longitudinal axis of the sacrificial structures including an angle of between 45 degrees and 90 degrees with a connecting axis of the interconnects running orthogonally with respect to the two interconnects, the sacrificial structures being produced from a material which is such that the sacrificial structures can be selectively removed from the dielectric layer;
forming the dielectric layer after the sacrificial structures have been formed, between the two interconnects, in such a manner that the sacrificial structures are at least partially enclosed by the dielectric layer; and
selectively removing the sacrificial structures from the dielectric layer.

* * * * *